(12) United States Patent
McNulty et al.

(10) Patent No.: US 6,583,522 B1
(45) Date of Patent: Jun. 24, 2003

(54) SWITCHABLE MULTIPLE SOURCE POWER SUPPLY

(75) Inventors: Thomas C. McNulty, Trenton, NJ (US); Anand Rangarajan, Berkeley Heights, NJ (US)

(73) Assignee: WorldWater Corp., Pennington, NJ (US)

( * ) Notice: Subject to any disclaimer, the term of this patent is extended or adjusted under 35 U.S.C. 154(b) by 152 days.

(21) Appl. No.: 09/670,079

(22) Filed: Sep. 27, 2000

(51) Int. Cl.[7] .................................................. H02J 1/00
(52) U.S. Cl. ......................................... 307/71; 323/906
(58) Field of Search .............................. 307/71, 64, 66, 307/65; 323/906; 136/206; 320/101, 117

(56) References Cited

U.S. PATENT DOCUMENTS

| | | | | |
|---|---|---|---|---|
| 4,175,249 A | * | 11/1979 | Gruber ........................ 136/293 |
| 4,375,593 A | * | 3/1983 | Winterbotham ............... 307/37 |
| 5,199,429 A | * | 4/1993 | Kroll et al. .................... 607/5 |
| 5,449,959 A | * | 9/1995 | Yang ............................. 307/63 |
| 5,461,264 A | * | 10/1995 | Yang ............................. 307/63 |
| 5,500,052 A | * | 3/1996 | Horiuchi et al. ............. 136/244 |
| 5,506,456 A | * | 4/1996 | Yang ............................. 307/63 |
| 5,514,916 A | * | 5/1996 | Yang |
| 5,684,385 A | * | 11/1997 | Guyonneau et al. |
| 5,914,869 A | * | 6/1999 | Troiano ....................... 307/110 |
| 6,060,790 A | * | 5/2000 | Craig, Jr. ...................... 307/71 |
| 6,262,494 B1 | * | 7/2001 | Tsukuni et al. ............... 307/80 |
| 6,376,932 B1 | * | 4/2002 | Yang ........................... 136/206 |

* cited by examiner

*Primary Examiner*—Brian Sircus
*Assistant Examiner*—Roberto J. Rios
(74) *Attorney, Agent, or Firm*—Henry P. Sartorio

(57) ABSTRACT

In a readily switchable multiple solar panel system, the individual solar panels are interconnected with a control or switching apparatus which allows the solar panels to be readily switched into various series, parallel, or series-parallel configurations. With a relay based switching apparatus, a relay is connected between a pair of solar panels, so that in a first state, the panels are in series where the total voltage is the sum of each individual panel's voltage. When the relay is switched to the second state, each solar panel is in parallel, where the total voltage is a single panel's voltage and the current is multiplied by the number of panels. Multiple panels can be connected in this manner, with a relay between each successive pair of panels. With each relay connected in a parallel arrangement, a simple control switch in series with the relay coils can control the panel switching. The coil of each relay can also be individually controlled. Other individual voltage sources than solar panels can similarly be connected through a switching system which provides selective configuration of the sources into series, parallel, or series-parallel arrangements.

14 Claims, 4 Drawing Sheets

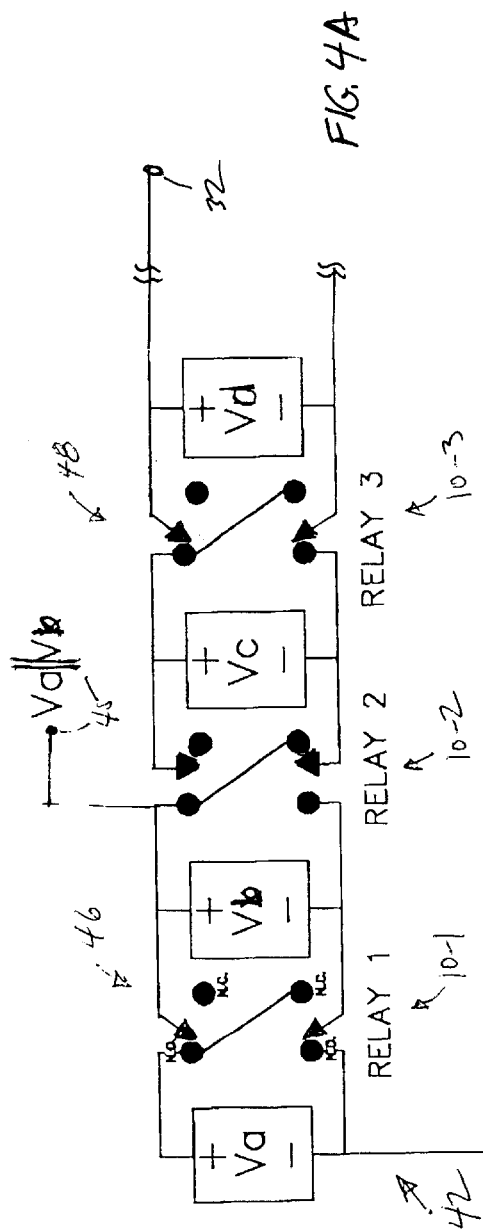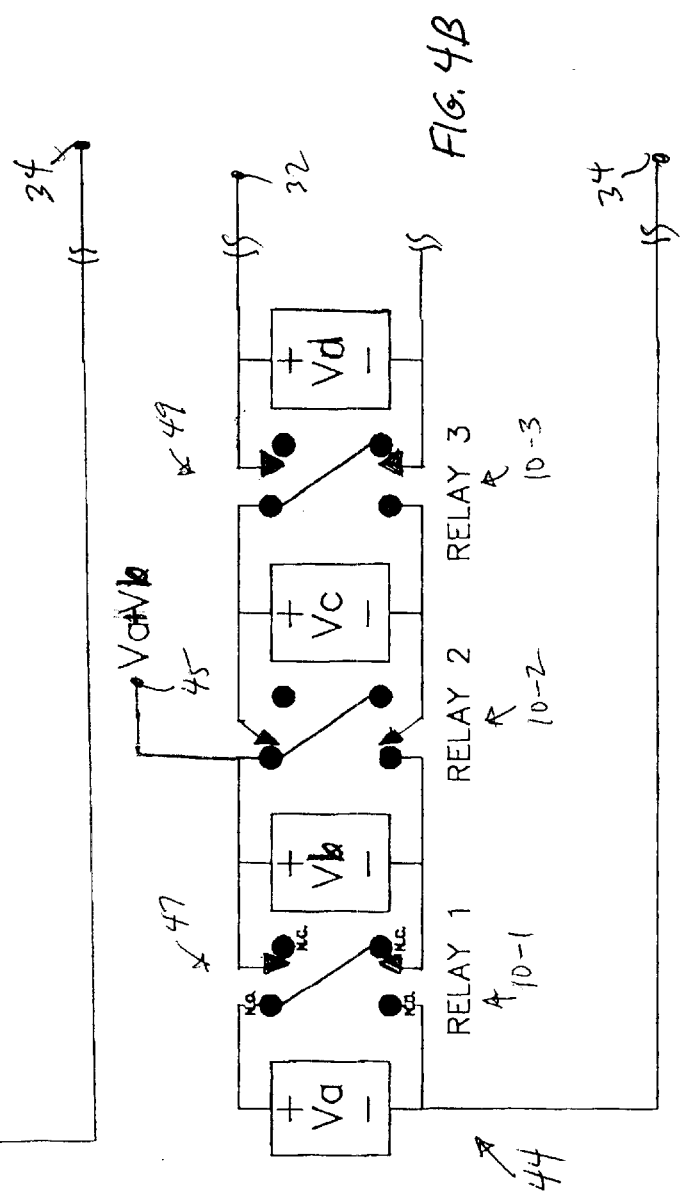

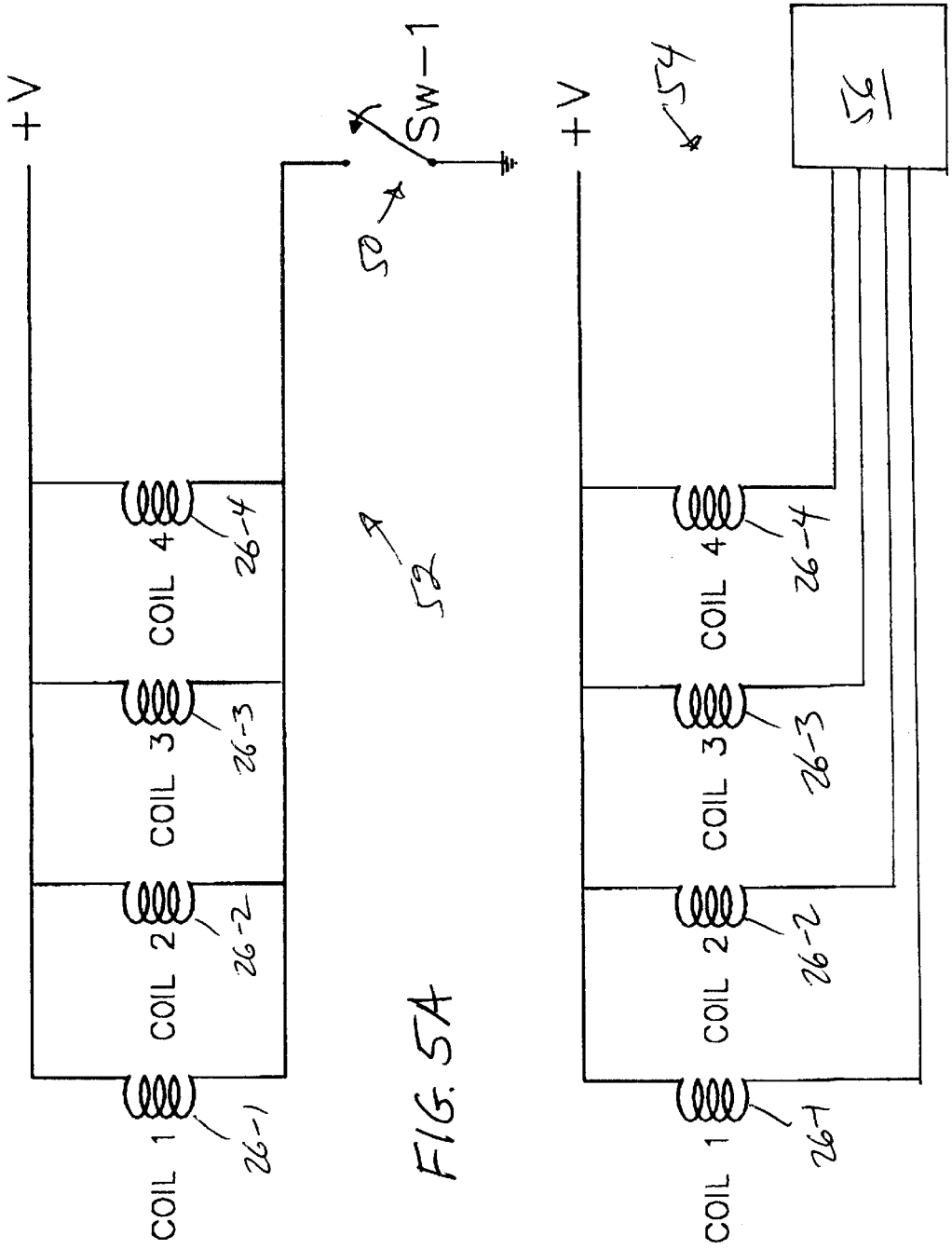

SWITCHABLE MULTIPLE SOURCE POWER SUPPLY

BACKGROUND OF THE INVENTION

The invention relates generally to power supplies formed of multiple voltage sources, and more particularly to switching systems for selectively configuring the multiple voltage sources in series, parallel, or series-parallel configurations. The invention applies particularly to solar panels.

Solar panels are used to convert solar energy to electrical energy. A solar power system is generally made up of a number of solar panels whose outputs are combined. However, because of changing solar conditions and different loads, the output of the solar power system and the load requirements are not constant. For example, at different times of the day (early morning or midday) and year (summer or winter), and under changing weather conditions (sunny or cloudy), the output voltage from each solar panel will vary significantly. Likewise, operation of a solar powered water pump under different conditions, or other applications such as powering lighting systems or charging batteries, will require different power levels, i.e. different output voltages and/or different output currents, from the solar power system.

Unfortunately, no system presently exists which allows rapid reconfiguration of a multi-panel solar power system to meet changing power production conditions and to respond to changing power demand requirements. Multi-panel systems are generally hard wired into a particular configuration which cannot readily be altered to effectively use the available outputs of each panel to satisfy user demands. Present solar systems do not offer a simple control apparatus for either electronic or manual switching from series to parallel arrangements.

The problems of multi-panel solar systems also apply to other power systems made up of multiple voltage sources where the individual voltage source outputs vary and/or the user demands change significantly during operation of the power system.

Accordingly it is desirable to provide multi-panel solar power systems or other multi-source power systems with simple control or switching systems which allow the multiple solar panels or other voltage sources to be readily reconfigured or switched into various series, parallel, or series-parallel configurations.

SUMMARY OF THE INVENTION

Accordingly it is an object of the invention to provide a power system formed of multiple solar panels or other voltage sources in which the multiple panels or other voltage sources are readily switchable into various series, parallel, or series-parallel configurations.

It is another object of the invention to provide a multi-panel solar power system which can be rapidly and easily reconfigured to meet changing power production conditions and to respond to changing power demand requirements.

It is also an object of the invention to provide a solar system with a simple control apparatus for either electronic or manual switching from series to parallel arrangements.

The invention is a readily switchable multiple solar panel (or other voltage source) system in which the individual solar panels are interconnected with a control or switching apparatus which allows the solar panels to be readily switched into various series, parallel, or series-parallel configurations. In a preferred embodiment, a relay is connected to each solar panel so that in a first state, the panels are in series where the total voltage is the sum of each individual panel's voltage. When the relay is switched to the second state, each solar panel is in parallel, where the total voltage is a single panel's voltage and the current is multiplied by the number of panels. With each relay connected in a parallel arrangement, a simple control switch in series with the relay coils can control the panel switching. The coil of each relay can also be individually controlled. Thus the switchable multiple voltage source power supply of the invention is formed by connecting individual panels (or other individual voltage sources) through a switching system which provides selective configuration of the individual panels into series, parallel, or series-parallel arrangements.

BRIEF DESCRIPTION OF THE DRAWINGS

FIGS. 4A, B are schematic diagrams of a switchable multiple voltage source system according to the invention with series-parallel configurations.

FIGS. 5A, B are schematic diagrams of switching systems for the invention.

DETAILED DESCRIPTION OF THE INVENTION

Figure 1:
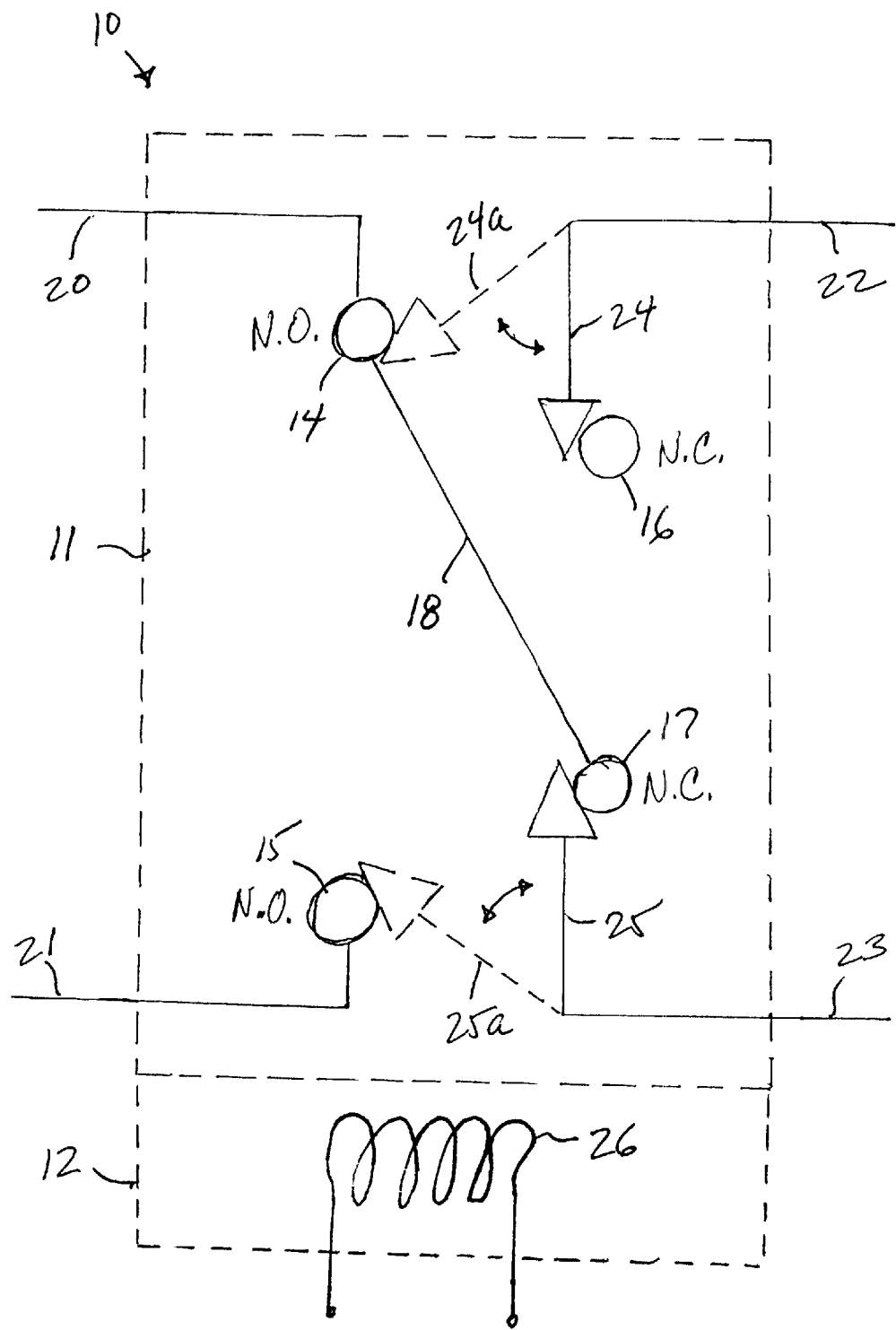
FIG. 1 illustrates a double pole double throw relay hard wired for use according to the invention.

As illustrated in FIG. 1, a double pole double throw relay 10 is configured to be used as a switching element in the invention. Relay 10 has two basic parts, relay or trip circuit 11 which provides the switching function, and energizing circuit 12 which actuates the switching function. Relay circuit 11 has two normally open (N.O.) contacts 14, 15 and two corresponding normally closed (N.C.) contacts 16, 17. N.O. contact 14 and N.C. contact 16 form one contact pair or pole of the relay 10 and N.O. contact 15 and N.C. contact 17 form a second contact pair or pole. N.O. contact 14 is electrically connected (hard wired) to N.C. contact 17 by wire 18. Relay circuit 11 has four external electrical connections 20, 21, 22, 23 through which electrical signals may be input to or output from relay 10. External electrical connections 20, 21 are directly connected to N.O. contacts 14, 15 respectively. External electrical connections 22, 23 are connected to relay wiper arms 24, 25 respectively. Energizing circuit 12 contains a relay coil 26 which is used to actuate the relay 10 by controlling the position of the relay arms 24, 25 in relay circuit 11.

When coil 26 is not energized, i.e. no current is flowing through coil 26, relay arms 24, 25 are in contact with N.C. contacts 16, 17 respectively. Thus external connections 22, 23 are connected to N.C. contact 16, 17 respectively. When coil 26 is energized, i.e. current flows through coil 26, relay arms 24, 25 are moved into contact with N.O. contacts 14, 15 respectively. External connections 22, 23 are then connected to N.O. contacts 14, 15 respectively, as indicated by positions 24a, 25a for wiper arms 24, 25.

In its normal configuration without wire 18, relay 10 acts as a switch between electrical connections 20 and 22, and also between electrical connections 21 and 23. When arms 24, 25 contact N.C. contacts 16, 17, the switch is open, i.e. electrical connection 20 is not connected to electrical connection 22 and electrical connection 21 is not connected to electrical connection 23. When arms 24, 25 are moved to positions 24a, 25a, the switch is closed, i.e. electrical connection 20 is connected to electrical connection 22 and electrical connection 21 is connected to electrical connection 23.

The addition of wire 18 from the N.O. contact of one contact pair to the N.C. contact of the other contact pair changes the operation of relay 10 and produces different connections between external electrical connections 20–24. When arms 24, 25 contact N.C. contacts 16, 17, electrical connection 20 is connected to electrical connection 23 and electrical connections 21, 22 are not connected. When arms 24, 25 are moved to positions 24a, 25a, electrical connection 20 is connected to electrical connection 22 and electrical connection 21 is connected to electrical connection 23.

Figure 2:
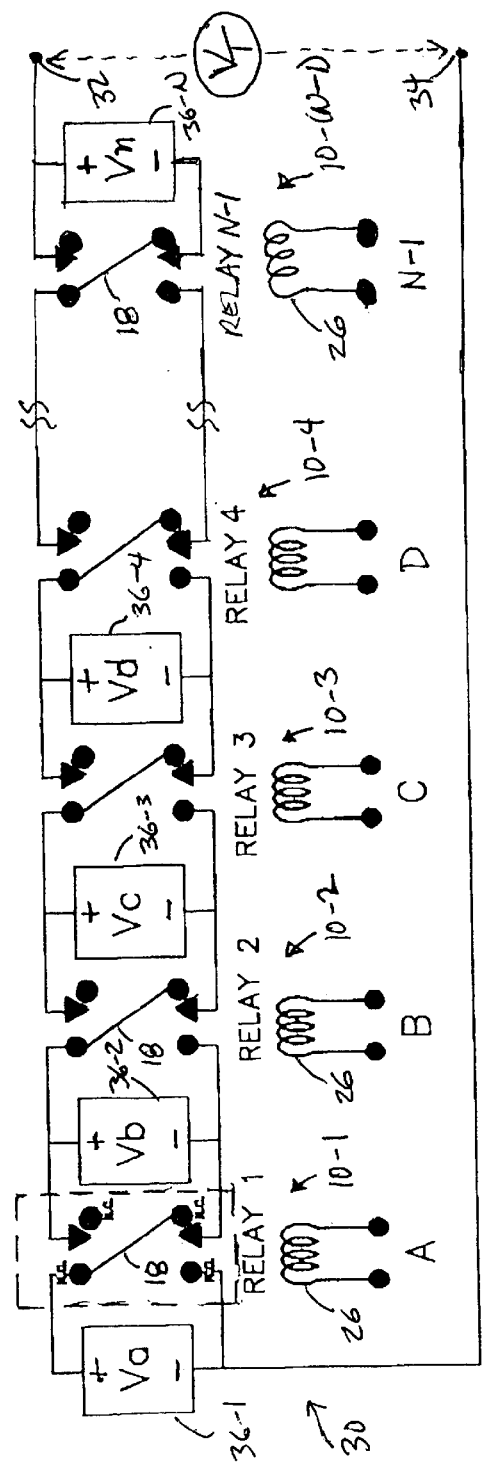
FIG. 2 is a schematic diagram of a switchable multiple voltage source system according to the invention with the switching system set for series operation.

As illustrated in FIG. 2, a switchable multiple voltage source power supply system 30 according to the invention is formed of a plurality of individual voltage sources 36-i, i=1 ... N, (also designated Va, Vb, Vc, Vd ... Vn), which in a preferred embodiment are solar panels. Each successive pair of voltage sources 36-i, 36-(i+1) is separated by a relay 10-i, i=1 ... (N−1), (also designated Relay 1 ... Relay N−1), i.e. Relay 1 between sources Va and Vb, Relay 2 between sources Vb and Vc, ... Relay N−1 between sources Vn−1 and Vn. Each of the relays 10-i is a double pole double throw relay configured like relay 10 of FIG. 1 with a N.O. contact of one pole hard wired to a N.C. contact of the other pole.

The positive terminal of voltage source Va is connected to the external connection 20 of relay 10-1 and the negative terminal of Va is connected to the external connection 21, i.e. source Va is connected to the N.O. contacts of Relay 1. The positive and negative terminals of source Vb are respectively connected to external connections 22, 23 and thus to relay wiper arms 24, 25 of relay 10-1, i.e. source Vb is connected through the relay wiper arms to the N.C. contacts of Relay 1 when Relay 1 is not energized. Sources Vb and Vc are similarly connected to Relay 2, and further sources are similarly connected to further relays. The positive terminal of the last source Vn is also connected to positive ouput terminal 32 and the negative terminal of the first source Va is also connected to the negative output terminal 34 of the power supply system 30. The total output voltage $V_T$ from system 30 is obtained across output terminals 32, 34.

Each of the relays Relay 1, 2, 3, 4 ... N−1 is energized by an associated relay coil 26 (A, B, C, D, ... N−1) whose operation will be described further with respect to FIGS. 5A, B. The relays Relay 1 ... N−1 form a switching system for the multiple voltage source power supply system which allows the individual voltage sources to be easily switched between series, parallel, and series-parallel configurations to reconfigure the power supply as needed. When the relays are all not energized, i.e. the wiper arms of all the relays are in contact with the N.C. contacts, the individual voltage sources Va ... Vn are connected in series. The positive terminal of each voltage source Vi is connected to the negative terminal of the next source Vi+1 through the hard wire 18 between N.O. contact 14 and N.C. contact 17 of relay 10-i. Thus power supply system 30 is in a series configuration with each individual source voltage in series, so that the total output voltage from system 30 is the sum of each source voltage, $V_{T=VA+VB+VC+VD}+ \ldots +VN$ where $V_A$ is the voltage of source Va, ... and $V_N$ is the voltage of source Vn.

Figure 3:
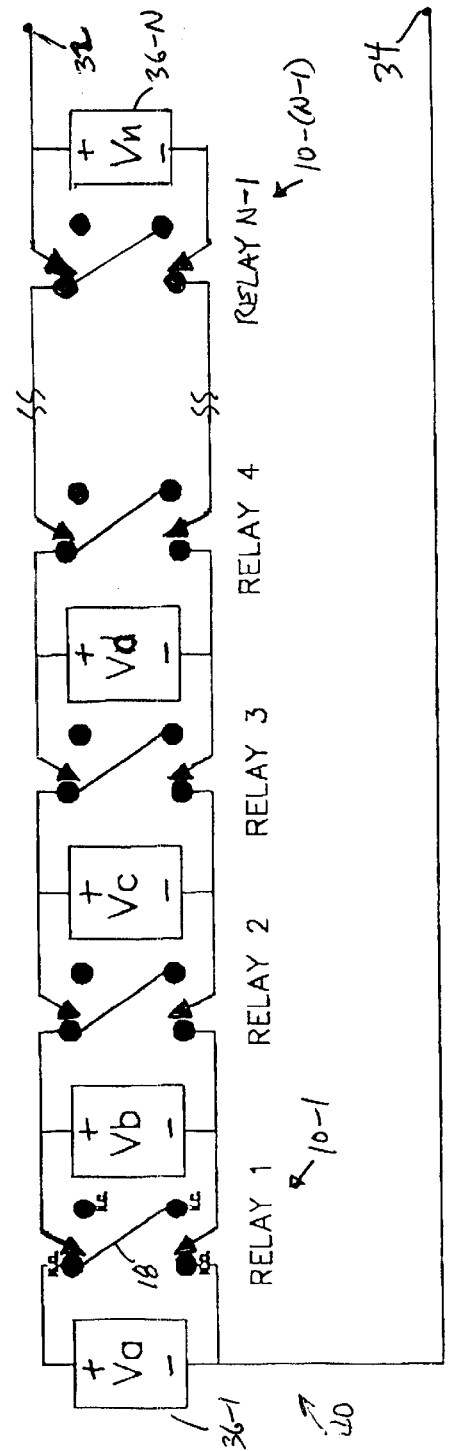
FIG. 3 is a schematic diagram of a switchable multiple voltage source system according to the invention with the switching system set for parallel operation.

As shown in FIG. 3, a switchable multiple voltage source power supply system 40 according to the invention is similar to series configured system 30 of FIG. 2 except that all the relays Relay 1 ... Relay N−1 have been energized through their coils A ... N−1 (not shown but the same as in FIG. 2). When the relays are energized, the wiper arms switch from the N.C. contacts to the N.O. contacts. In this arrangement, all the positive terminals of sources Va ... Vn are connected together through the first poles of the relays to output terminal 32, and all the negative terminals are connected together through the second poles of the relays to output terminal 34. The output voltage of the system 40 is then just the voltage from each individual source, $V_{T=VA=VB=VC=VD}= \ldots =V_N$, but the current is the sum of the currents from each source.

Thus, when relay 10 as shown in FIG. 1, is connected between a pair of individual voltage sources 36-i, 36-(i+1), as shown in FIGS. 2–3, relay 10 provides a simple switch between series and parallel connections of the voltage sources. The unenergized state of the relay 10, i.e. when the wiper arms are at the N.C. contacts, is the series position in which the voltage sources are in a series connection through wire 18. The energized state of the relay 10, i.e. when the wiper arms are at the N.O. contacts, is the parallel position in which the voltage sources are in a parallel connection, bypassing wire 18.

In the multiple source systems 30, 40 shown in FIGS. 2–3, all the relays are either not energized (series configuration) or energized (parallel configuration). By independently controlling each relay, other configurations can be realized, as illustrated by systems 42, 44 shown in FIGS. 4A, B. System 42 has two sets of parallel stages arranged in series. Relays 1 and 3 are energized while Relay 2 is not energized. Thus Va and Vb are connected in parallel to form a first bank or stage 46, and Vc and Vd are connected in parallel to form a second bank or stage 48. First bank 46 is connected in series with second bank 48 through Relay 2. The output from system 42 is $V_T=(V_{A||VB})+(V_{C||VD})=V_{A+VC=VB+VD}$. The current output is $I_{T=IA+IB=IC+ID}$. Additional stages may be added and more than two voltage sources may be included in each stage.

System 44 has two sets of series stages arranged in parallel. Relays 1 and 3 are not energized while Relay 2 is energized. Thus Va and Vb are connected in series to form a first bank or stage 47, and Vc and Vd are connected in series to form a second bank or stage 49. First bank 47 is connected in parallel with second bank 49 through Relay 2. The output from system 44 is $V_{T=VA+VB=VC+VD}$. The current output is $I_{T=IA+IC=IB+ID}$. Additional stages may be added and more than two voltage sources may be included in each stage.

The output of the first bank 46, 47 (and from other similar stages) of systems 44, 46 may be separately applied from the rest of the system. Intermediate output terminal 45 provides an output from the first stage 46 or 47. Thus all the individual voltage sources, e.g. solar panels, may be switched in series, as shown in FIG. 2, to produce a total output for one application, e.g. water pumping. At other times, the individual voltage sources can be reconfigured with all the sources in parallel, as shown in FIG. 3, or in various series-parallel arrangements, as illustrated in FIGS. 4A, B. Outputs from different stages may be independently used (additional switches may be needed to isolate the different stages).

As shown in FIG. 5A, with each relay coil 26-1, 26-2, 26-3, 26-4 connected in a parallel arrangement, a simple control switch 50 (Sw-1) in series with the relay coils can control the voltage source switching. Switch 50 may be a manual switch or an electronic switch. Switch 50 may also be a remotely operated switch, e.g. a RF receiver. The simple switching system of FIG. 5A with all the relay coils in parallel can only produce a series power supply system configuration when all the relay coils are not energized, and a parallel power supply system configuration when all the relay coils are energized.

A more complex switching system 54, shown in FIG. 5B, utilizes a more complex control switch 56 which individually controls each relay coil 26-1, 26-2, 26-3, 26-4. Thus each relay can separately be energized or not energized so that other system configurations can be achieved.

A particular application of the present invention is to a solar power supply system made up of multiple solar panels. The system is used for both well pumping and battery charging operations. During morning and evening hours, when the solar panels cannot supply sufficient power to drive a motor at adequate speed to deliver water, the panels can be switched to parallel operation for battery charging. When significant power becomes available, the system switches to series operation for pumping, thereby providing a dual function. The switch could be remotely operated with a RF receiver. Timing functions could be programmed into the switch to provide switching at preselected times for needed operations, e.g. to provide electricity to individual homes at certain times of the day. For systems that use a storage tank, a float switch may be used so that when the water tank is full, the system automatically switches to battery charging.

While the invention has been described with respect to a switching system based on relays, the relays could be replaced with other types of electronic switches.

Changes and modifications in the specifically described embodiments can be carried out without departing from the scope of the invention which is intended to be limited only by the scope of the appended claims.

What is claimed is:

1. A power supply system, comprising:
    a plurality of individual voltage sources;
    a switching system connected to the plurality of voltage sources for selectively configuring the plurality of voltage sources in series, parallel, or series-parallel arrangements;
    wherein the switching system comprises a plurality of double pole double throw relays with a relay between each successive pair of voltage sources, and a switch connected to the relays to actuate the relays;
    wherein a normally open contact of one pole of a relay is hard wired to a normally closed contact of the other pole of the relay.

2. The system of claim 1 wherein the voltage sources are solar panels.

3. The system of claim 1 wherein the wiper arms of each relay contact the normally closed contacts of the relay when the relay coil is not energized, and contact the normally open contacts of the relay when the relay coil is energized.

4. The system of claim 3 wherein a first voltage source is connected to the normally open contacts of the relay and a second voltage source is connected to the wiper arms of the relay so that the first and second voltage sources are connected in series through the hard wire between a normally open contact of one pole of the relay and a normally closed contact of the other pole of the relay when the relay coil is not energized, and the first and second voltage sources are connected in parallel when the relay coil is energized.

5. The system of claim 1 wherein the coils of all the relays are connected in parallel and the switch is in series with the relay coils.

6. The system of claim 1 wherein the switch controls each relay separately.

7. The system of claim 1 wherein the switch is a manual switch, an electronic switch, or a remotely controlled switch.

8. A solar power supply system, comprising:
    a plurality of individual solar panels;
    a switching system connected to the plurality of solar panels for selectively configuring the plurality of solar panels in series, parallel, or series-parallel arrangements to meet changing power production conditions and to respond to changing power demand requirements;
    wherein the switching system comprises a plurality of double pole double throw relays with a relay between each successive pair of voltage sources, and a switch connected to the relays to actuate the relays;
    wherein a normally open contact of one pole of a relay is hard wired to a normally closed contact of the other pole of the relay.

9. The system of claim 8 wherein the wiper arms of each relay contact the normally closed contacts of the relay when the relay coil is not energized, and contact the normally open contacts of the relay when the relay coil is energized.

10. The system of claim 9 wherein a first solar panel is connected to the normally open contacts of the relay and a second solar panel is connected to the wiper arms of the relay so that the first and second solar panels are connected in series through the hard wire between a normally open contact of one pole of the relay and a normally closed contact of the other pole of the relay when the relay coil is not energized, and the first and second solar panels are connected in parallel when the relay coil is energized.

11. The system of claim 8 wherein the coils of all the relays are connected in parallel and the switch is in series with the relay coils.

12. The system of claim 8 wherein the switch controls each relay separately.

13. The system of claim 8 wherein the switch is a manual switch, an electronic switch, or a remotely controlled switch.

14. A solar power supply system, comprising:
    a plurality of individual solar panels;
    a switching system connected to the plurality of solar panels for selectively configuring the plurality of solar panels in series, parallel, or series-parallel arrangements to meet changing power production conditions and to respond to changing power demand requirements;
    wherein the switching system comprises a plurality of relays with a relay between each successive pair of voltage sources, and a switch connected to the relays to actuate the relays;
    wherein each relay is hard wired to provide a series connection therethrough in one state and a parallel connection therethrough in a second state.

* * * * *